(12) United States Patent
Fujiki et al.

(10) Patent No.: US 6,339,257 B1
(45) Date of Patent: *Jan. 15, 2002

(54) SEMICONDUCTOR DEVICE (75) Inventors: Noriaki Fujiki; Takashi Yamashita; Shigeru Harada; Kazunobu Miki, all of Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/352,338

(22) Filed: Jul. 13, 1999

(30) Foreign Application Priority Data

Jan. 28, 1999 (JP) ............................. 11-019841

(51) Int. Cl.[7] ................................. H01L 23/48
(52) U.S. Cl. ..................... 257/751; 257/763; 257/764; 257/781
(58) Field of Search ................. 257/751, 753, 257/754, 757, 763, 764, 780, 781; 438/612, 655, 656

(56) References Cited

U.S. PATENT DOCUMENTS

| 5,523,626 A | | 6/1996 | Hayashi et al. ............. 257/763 |
| 5,637,924 A | * | 6/1997 | Hibino ........................ 257/751 |
| 5,661,081 A | | 8/1997 | Hsue et al. ................. 438/106 |
| 5,719,448 A | * | 2/1998 | Ichikawa .................... 257/781 |
| 5,723,822 A | * | 3/1998 | Lien ........................... 174/250 |
| 5,734,200 A | * | 3/1998 | Hsue et al. ................. 257/755 |
| 5,869,902 A | * | 2/1999 | Lee et al. ................... 257/773 |

FOREIGN PATENT DOCUMENTS

JP 5-243320 9/1993

* cited by examiner

Primary Examiner—T. N. Quach
(74) Attorney, Agent, or Firm—McDermott, Will & Emery (57) ABSTRACT

A semiconductor device which is provided with enhanced reliability and capable of preventing cracking of a layer below an interconnection layer and separation of the interconnection layer and a bonding pad electrode layer. The semiconductor device includes: an interconnection layer including a conductive material formed on a silicon substrate; an intermediate layer formed in contact with interconnection layer and including a titanium layer and a titanium nitride layer; and a bonding pad electrode layer which is in contact with the intermediate layer.

4 Claims, 6 Drawing Sheets

SEMICONDUCTOR DEVICE

BACKGROUND OF THE INVENTION

1. Field of the Invention

The present invention relates to semiconductor devices and, more particularly to a semiconductor device having a bonding pad electrode.

2. Description of the Background Art

Recently, as the integration degree of the semiconductor devices increases and the devices are provided with multiple functions, the interconnections thereof are increasingly fine patterned and formed with multiple layers. Thus, a multilayer interconnection technique is important. Such multilayer interconnection is connected to a bonding pad electrode, which is electrically connected to a lead pin by a bonding wire.

Figure 8:
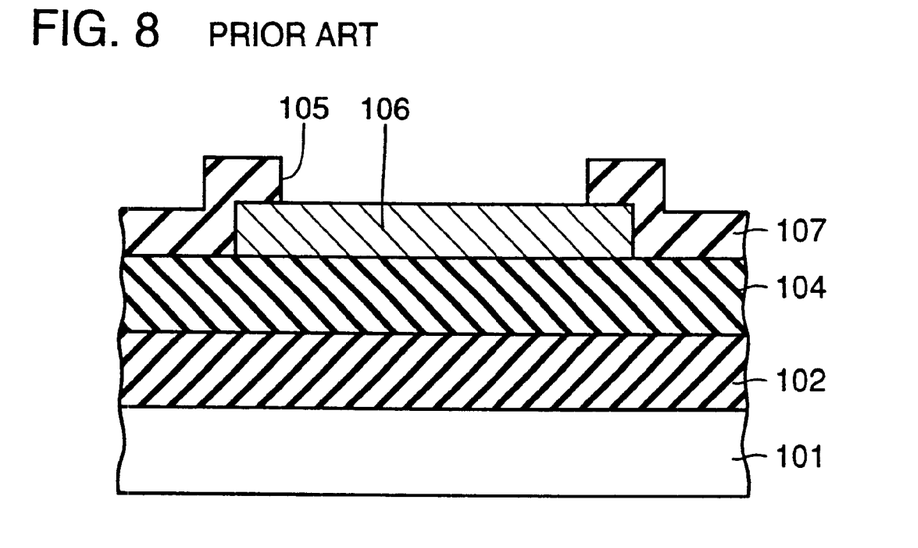
FIG. 8 is a cross sectional view showing a structure of a conventional bonding pad electrode.

FIG. 8 is a cross sectional view showing a structure of a conventional bonding pad electrode. Referring to FIG. 8, an interlayer insulating film 102 is formed on a silicon substrate 101. An interlayer insulating film 104 is formed on interlayer insulating film 102. A large number of interconnection layers (not shown) are formed in interlayer insulating films 102 and 104. A bonding pad electrode 106 which is electrically connected to these interconnection layers is formed on interlayer insulating film 104. An interlayer insulating film 107 is formed on interlayer insulating film 104 to cover bonding pad electrode 106. A via hole 105 is formed in interlayer insulating film 107 which exposes a part of a surface of bonding pad electrode 106.

Recently, fine patterning is also required for such bonding pad electrode. Thus, a width and thickness of bonding pad electrode 106 as shown in FIG. 8 are increasingly reduced.

Figure 9:
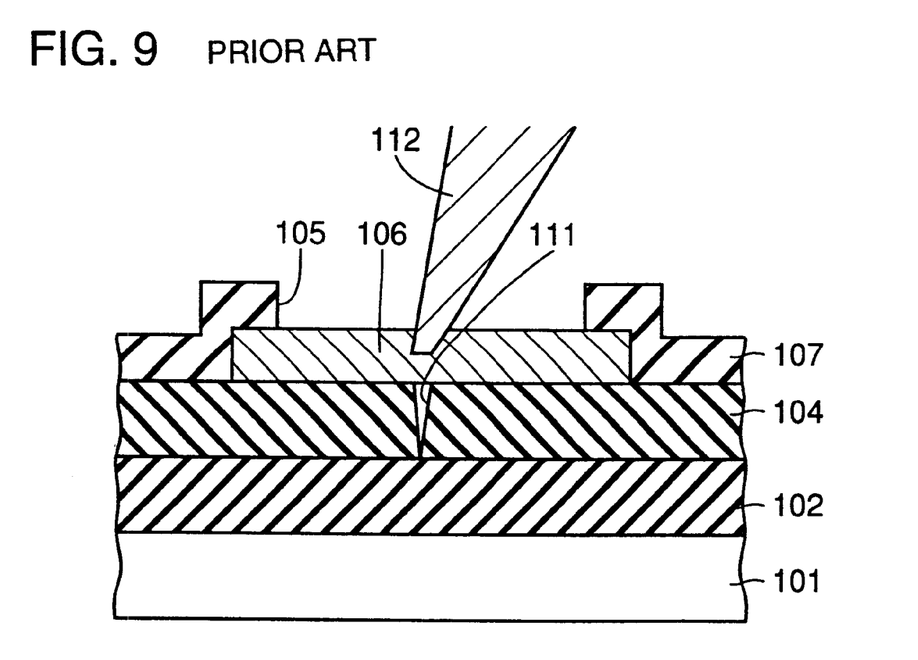
FIG. 9 is a cross sectional view showing a bonding pad electrode shown in conjunction with a problem associated with the conventional bonding pad electrode.

FIG. 9 is a cross sectional view showing a bonding pad electrode shown in conjunction with a problem associated with the conventional bonding pad electrode. As shown in FIG. 9, in a conventional semiconductor device, a test called a wafer test is performed before dicing the wafer. A probe needle 112 generally including tungsten is brought into contact with a bonding pad electrode 106 for an electrical test. As a thin oxide film ($Al_2O_3$) is formed on a surface of bonding pad electrode 106, a certain degree of load must be applied to probe needle 112 against bonding pad electrode 106 to break the oxide film, so that electrical conduction between bonding pad electrode 106 and probe needle 112 is ensured. At the time, no particular problem arises when a thickness of bonding pad electrode 106 is equal to or larger than 8000 Å. However, when the thickness of bonding pad electrode 106 is smaller than 8000 Å, an external force applied by probe needle 112 concentrates stress at one portion of interlayer insulating film 104 under bonding pad electrode 106. Thus, a crack 111 appears in interlayer insulating film 104.

Figure 10:
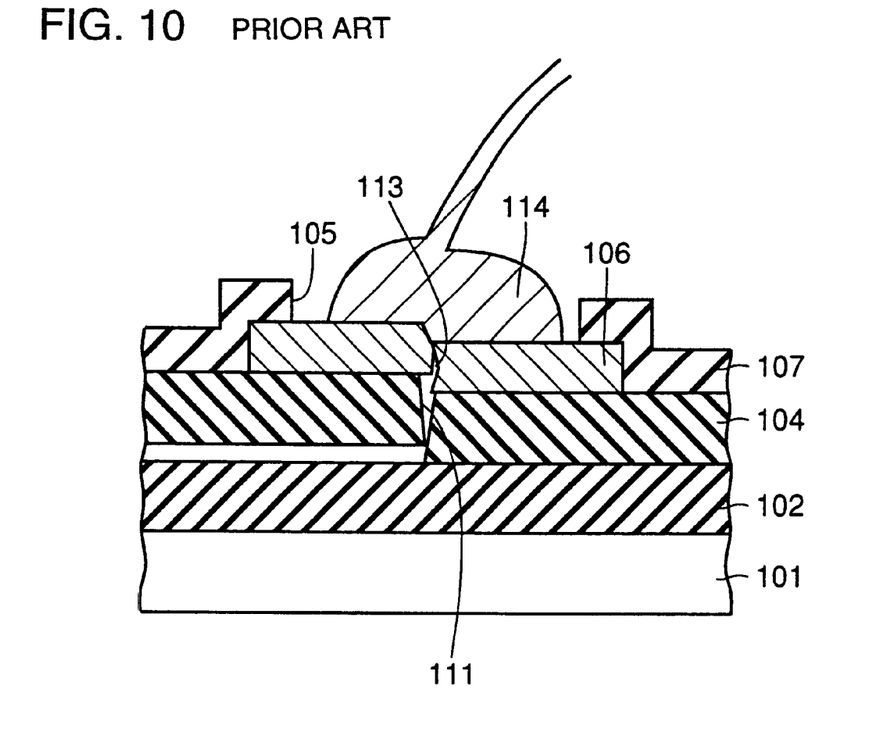
FIG. 10 is a cross sectional view showing the bonding pad electrode shown in conjunction with a problem associated with connection of a bonding wire to the bonding pad electrode shown in FIG. 9.

FIG. 10 is a cross sectional view showing a bonding pad electrode shown in conjunction with a problem associated with connection of a bonding wire to the bonding pad electrode shown in FIG. 9. Referring to FIG. 10, if a bonding wire 114 is connected to the bonding pad electrode on interlayer insulating film 104 in which the crack is formed as shown in FIG. 9, a cracked portion 113 is formed in bonding pad electrode 116 from crack 111 when connecting bonding wire 114. Cracked portion 113 causes a problem of unstable electrical connection. Further, moisture entering from cracked portion 113 disadvantageously reduces resistance to moisture of the semiconductor device.

Figure 11:
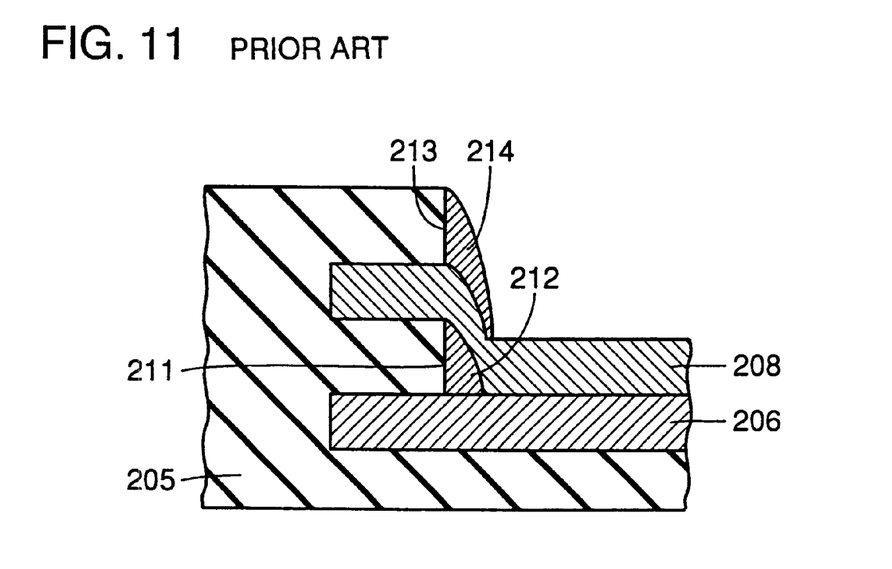
FIGS. 11 to 13 are cross sectional views showing a conventional semiconductor device described in the aforementioned Laying-Open Application.
Figure 12:
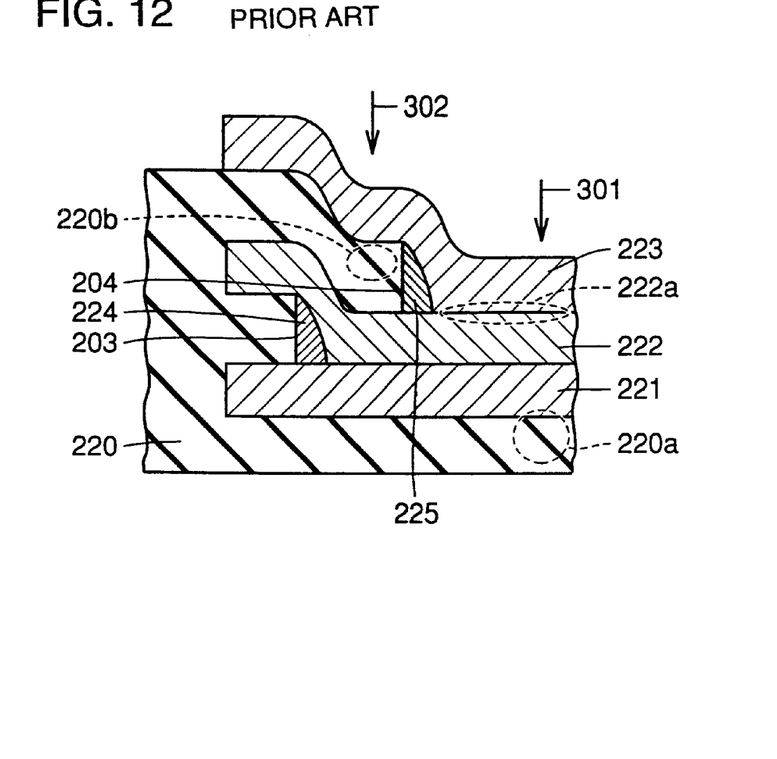
Figure 13:
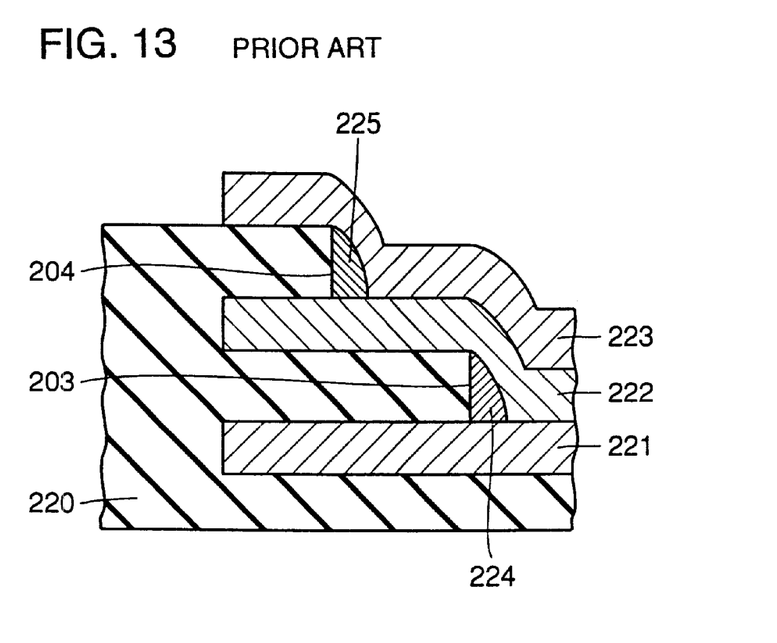

Conventionally, a semiconductor device in which a bonding pad electrode and an interconnection layer positioned thereunder are in direct contact with each other has also been known. FIGS. 11 to 13 are cross sectional views showing a semiconductor device described in Japanese Patent Laying-Open No. 5-243320. Referring to FIG. 11, in the semiconductor device as a conventional example, a lower aluminum interconnection 206 is formed on an interlayer insulating film 205. A lower via hole 211 leading to lower aluminum interconnection 206 is formed in interlayer insulating film 205. A tungsten sidewall 212 is formed on a sidewall of lower via hole 211. An upper aluminum interconnection 208 is formed as a bonding pad electrode in contact with tungsten sidewall 212 and lower aluminum interconnection 206. An upper via hole 213 leading to upper aluminum interconnection 208 is formed in interlayer insulating film 205. A tungsten sidewall 214 is formed in contact with a sidewall of upper via hole 213 and upper aluminum interconnection 208.

Referring to FIG. 12, as another conventional example, a first aluminum interconnection 221 is formed in contact with an interlayer insulating film 220. A lower via hole 203 leading to first aluminum interconnection 221 is formed in an interlayer insulating film 220. A tungsten sidewall 224 is formed in contact with a sidewall of lower via hole 203 and first aluminum interconnection 221. A second aluminum interconnection 222 is formed in contact with tungsten sidewall 224 and first aluminum interconnection 221. An upper via hole 204 leading to second aluminum interconnection 222 is formed in interlayer insulating film 220. A diameter of lower via hole 203 is larger than that of upper via hole 204. A tungsten sidewall 225 is formed in contact with a sidewall of upper via hole 204 and second aluminum interconnection 222. A third aluminum interconnection 223 is formed as a bonding pad electrode in contact with tungsten sidewall 225 and second aluminum interconnection 222.

Referring to FIG. 13, in still another embodiment of a semiconductor device, a diameter of lower via hole 203 is smaller than that of upper via hole 204. In this respect, it is different from the semiconductor device shown in FIG. 12 in which the diameter of lower via hole 203 is larger than upper via hole 204. Other parts of the structure are similar to those of the semiconductor device shown in FIG. 12.

As the bonding pad electrode and the interconnection layer thereunder are directly in contact with each other as shown in FIGS. 11 to 13, the crack in the interlayer insulating film and the breakage of the bonding pad electrode as shown in FIGS. 9 and 10 can be prevented to a certain extent.

However, the semiconductor devices shown in FIGS. 11 to 13 still suffer from various problems. In the semiconductor device shown in FIG. 12, for example, as strengths of first to third aluminum interconnections 221 to 223 are relatively low, if an external force is applied to third aluminum interconnection 223 by a probe needle in a direction indicated by an arrow 301, the external force concentrates stress at a portion 220a of interlayer insulating film 220 directly below third aluminum interconnection 223. Thus, a crack is formed at portion 220a of interlayer insulating film 220, whereby first to third aluminum interconnections 221 to 223 thereabove may be cracked.

Further, when the external force is applied to third aluminum interconnection 223 by the probe needle in a direction indicated by an arrow 302, a crack is formed at a portion 220b of interlayer insulating film 220 directly below third aluminum interconnection 223. The crack would also result in the problem described in conjunction with FIGS. 9 and 10.

In addition, when the probe needle is brought into contact with third aluminum interconnection 223 and then separated therefrom, third aluminum interconnection 223 may come off from second aluminum interconnection 222 as the probe needle and third aluminum interconnection 223 are in a tight contact. Thus, third aluminum interconnection 223 may come off from second aluminum interconnection 222 at an interface 222a, thereby disadvantageously causing a loose connection.

SUMMARY OF THE INVENTION

The present invention is made to solve the aforementioned problems. An object of the present invention is to provide a semiconductor device with high reliability capable of preventing cracking in a layer below an interconnection layer.

Another object of the present invention is to provide a semiconductor device with high reliability capable of preventing separation of conductive layers which are in contact with each other.

A semiconductor device according to one aspect of the present invention includes an interconnection layer, an intermediate layer and a bonding pad electrode layer. The interconnection layer is formed on a semiconductor substrate. The intermediate layer is formed in contact with the interconnection layer and includes at least one material selected from a group of titanium, molybdenum, tungsten, titanium silicide, molybdenum silicide, tungsten silicide, titanium nitride, molybdenum nitride and tungsten nitride. The bonding pad electrode layer is in contact with the intermediate layer.

In the semiconductor device having the above described structure, a strength of the intermediate layer is high as it includes at least one material selected from a group of titanium, molybdenum, tungsten, titanium silicide, molybdenum silicide, tungsten silicide, titanium nitride, molybdenum nitride and tungsten nitride. Thus, even when a significant force is applied to a portion of the bonding pad electrode layer by a probe needle, the force is dispersed in the intermediate layer. As the force is dispersed generally to the interconnection layer below the intermediate layer, cracking of the layer below the interconnection layer is prevented. As a result, the semiconductor device with high reliability is provided.

Further, as titanium, molybdenum, tungsten, titanium silicide, molybdenum silicide, tungsten silicide, titanium nitride, molybdenum nitride and tungsten nitride included in the intermediate layer form tight connections with other materials, the interconnection layer and bonding pad electrode layer which are both in contact with the intermediate layer are more tightly connected. Thus, separation of the interconnection layer and intermediate layer or the bonding pad electrode layer and intermediate layer are prevented. As a result, the semiconductor device with high reliability is provided.

More preferably, the semiconductor device further includes a first insulating layer. The first insulating layer is provided with a first hole which exposes a part of a surface of the interconnection layer and formed to cover the interconnection layer. The bonding pad electrode layer is formed in the first hole to be connected to the surface of the interconnection layer with the intermediate layer interposed.

More preferably, a diameter of the first hole is at least 50 μm and at most 120 μm. A depth of the first hole is not larger than 1 μm.

More preferably, the semiconductor device further includes a second insulating layer covering the bonding pad electrode layer. A second hole leading to the bonding pad electrode layer is formed in the second insulating layer. In this case, a bonding wire can be provided in the second hole leading to the bonding pad electrode layer.

More preferably, the bonding pad electrode layer and intermediate layer are in contact with each other directly below the hole, and the intermediate layer and interconnection layer are also in contact with each other. In this case, even when a significant force is applied to the bonding pad electrode layer, it is dispersed generally to the interconnection layer which is positioned therebelow, so that cracking of the layer below the interconnection layer is efficiently prevented.

More preferably, the intermediate layer includes first and second intermediate layers. The first intermediate layer is in contact with the interconnection layer. The second intermediate layer is in contact with the bonding pad electrode layer and has a composition which is different from that of the first intermediate layer. In this case, for example, if layers which are high particularly in mechanical strength and in adhesion are respectively used for the first and second intermediate layers, the intermediate layer is provided with two different characteristics. As a result, a structure with high reliability can be provided.

More preferably, the first and second intermediate layers include titanium (Ti) and titanium nitride (TiN), respectively.

More preferably, the interconnection layer and a bonding pad electrode layer are formed of layers including aluminum. A high adhesion is obtained between aluminum and the intermediate layer in the interconnection layer and bonding pad electrode layer, separation of the interconnection and intermediate layers as well as the bonding pad electrode layer and the intermediate layer are prevented. Further, the intermediate layer serves to prevent diffusion of aluminum.

A semiconductor device according to another aspect of the present invention includes an interconnection layer, intermediate layer and bonding pad electrode layer. The interconnection layer includes a conductive material formed on a semiconductor substrate. The intermediate layer is formed in contact with the interconnection layer and includes at least one material selected from a group of titanium, molybdenum, tungsten, titanium silicide, molybdenum silicide, tungsten silicide, titanium nitride, molybdenum nitride and tungsten nitride. The bonding pad electrode layer is formed in contact with the intermediate layer and includes the conductive material which is the same as that of the interconnection layer.

In the semiconductor device having the above described structure, a strength of the intermediate layer is high as it includes at least one material selected from a group of titanium, molybdenum, tungsten, titanium silicide, molybdenum silicide, tungsten silicide, titanium nitride, molybdenum nitride and tungsten nitride. Thus, even when a significant force is applied to a portion of the bonding pad electrode layer by a probe needle, the force is dispersed in the intermediate layer. Thus, the force is dispersed generally to the interconnection layer formed below the intermediate layer, so that cracking in a layer formed below the interconnection layer is prevented. As a result, the semiconductor device with high reliability is obtained.

In addition, as titanium, molybdenum, tungsten, titanium silicide, molybdenum silicide, tungsten silicide, titanium nitride, molybdenum nitride and tungsten nitride included in the intermediate layer are high in adhesion with other materials, separation of the interconnection intermediate layers as well as that of the intermediate and bonding pad electrode layers are prevented. Thus, the layers are provided with enhanced adhesion and the semiconductor device with high reliability can be provided.

More preferably, the conductive material includes aluminum. As adhesion between aluminum in the conductive material and the intermediate layer is high, adhesion between the interconnection intermediate layers as well as that between the intermediate and bonding pad electrode layers are increased. As a result, separation of the interconnection and intermediate layers as well as that of the intermediate and bonding pad electrode layers are prevented, and the semiconductor device with high reliability can be provided.

A semiconductor device according to still another aspect of the present invention includes an interconnection layer, a first insulating layer, an intermediate layer, a sidewall conductive layer and a bonding pad electrode layer. The interconnection layer is formed on a semiconductor substrate. The first insulating layer covers the interconnection layer and includes a first hole. The first hole allows a portion of a surface of the interconnection layer to be exposed. The first hole also has a sidewall. The intermediate layer covers a surface of the first insulating layer, a sidewall of the first hole and the exposed portion of the surface of the interconnection layer, and includes at least one material selected from a group of titanium, molybdenum, tungsten, titanium silicide, molybdenum silicide, tungsten silicide, titanium nitride, molybdenum nitride and tungsten nitride. A sidewall conductive layer is formed on the sidewall of the first hole with the intermediate layer interposed. The bonding pad electrode layer is formed in the first hole to be connected to the surface of the interconnection layer with the intermediate layer interposed.

In the semiconductor device having the above described structure, a strength of the intermediate layer is increased as it includes at least one material selected from a group of titanium, molybdenum, tungsten, titanium silicide, molybdenum silicide, tungsten silicide, titanium nitride, molybdenum nitride and tungsten nitride. Thus, a significant force is applied to a portion of the bonding pad electrode layer by a probe needle, which force is transmitted to the intermediate layer through the first hole provided in the first insulating layer. Thus, the force is dispersed generally to the interconnection layer formed below the intermediate layer, so that cracking in a layer formed below the interconnection layer is prevented. As a result, the semiconductor device with high reliability can be provided.

As titanium, molybdenum, tungsten, titanium silicide, molybdenum silicide, tungsten silicide, titanium nitride, molybdenum nitride and tungsten nitride in the intermediate layer have high adhesion with other materials, adhesion between the interconnection and intermediate layers as well as that between the intermediate and bonding pad electrode layers are increased. As a result, separation of the interconnection and intermediate layers and that of the intermediate and bonding pad electrode layers are prevented, so that the semiconductor device with enhanced reliability is provided. In addition, the sidewall conductive layer formed on the sidewall of the first hole prevents cracking at the sidewall of the first hole.

More preferably, the interconnection and bonding pad electrode layers include aluminum. In this case, as adhesion between aluminum and the intermediate layer is high, the adhesion between the interconnection and intermediate layers as well as that between the bonding pad electrode and the intermediate layers can be further increased. As a result, separation of the interconnection and intermediate layers and that of the intermediate and the bonding pad electrode layers are prevented, so that the semiconductor device with high reliability can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will now be described with reference to the drawings.

Figure 1:
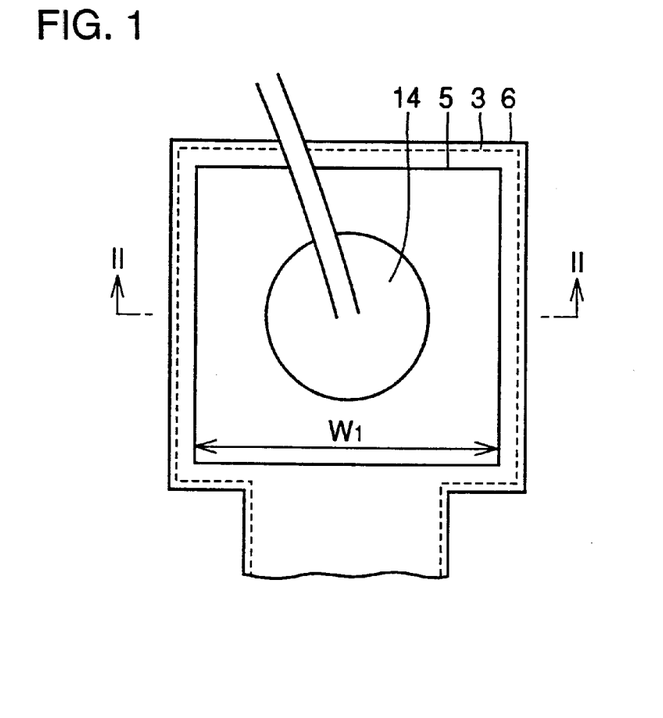
FIG. 1 is a top view of a semiconductor device according to the present invention.
Figure 2:
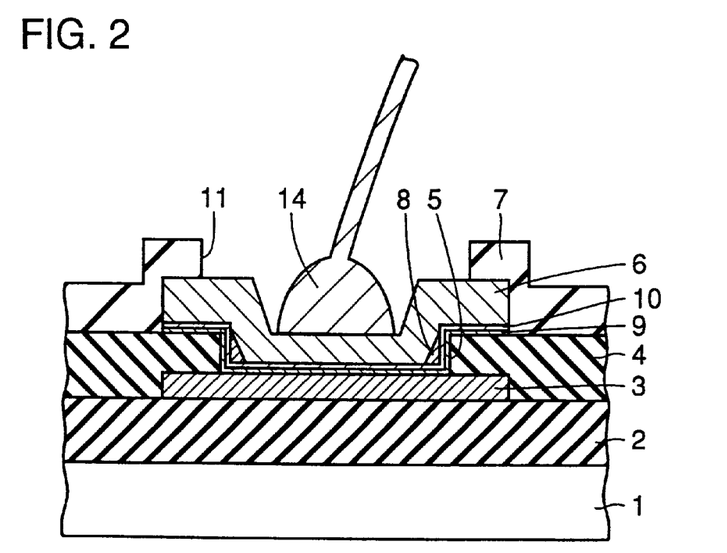
FIG. 2 is a view showing a cross section taken along the line II—II in FIG. 1.

Referring to FIGS. 1 and 2, an interlayer insulating film 2 including a silicon oxide film is formed on a silicon substrate 1. An interconnection layer 3 including aluminum is formed on interlayer insulating film 2. An interlayer insulating film 4 as a first insulating layer including a silicon oxide film is formed to cover interconnection layer 3. A via hole 5 is formed in interlayer insulating film 4 as a first hole leading to interconnection layer 3. A length of a side of the via hole (a length corresponding to $W_1$ in FIG. 1) is about 100 μm. A depth of the via hole is about 1 μm. Via hole 5 allows a surface of interconnection layer 3 to be exposed. A titanium (Ti) layer 9 as a first intermediate layer and a titanium nitride (TiN) layer 10 as a second intermediate layer are formed on the exposed surface of interconnection layer 3, a sidewall of via hole 5 and a surface of interlayer insulating film 4. Titanium layer 9 and titanium nitride layer 10 form the intermediate layer. Titanium layer 9 is in contact with interconnection layer 3 and titanium nitride layer 10. A sidewall conductive layer 8 as a sidewall conductive layer including tungsten is formed in contact with titanium nitride layer 10. A bonding pad electrode layer 6 is formed in contact with sidewall conductive layer 8 and titanium nitride layer 10. Bonding pad electrode layer 6 includes aluminum. Bonding pad electrode layer 6 and titanium nitride layer 10 are directly in contact with each other. A passivation film 7 as a second insulating layer is formed to cover bonding pad electrode layer 6. A via hole 11 is formed in passivation film 7 as a second hole leading to bonding pad electrode layer 6. A bonding wire 14 for electrically connecting an external device and the semiconductor device is connected to bonding pad electrode layer 6. Bonding wire 14 includes aluminum or gold.

Figure 3:
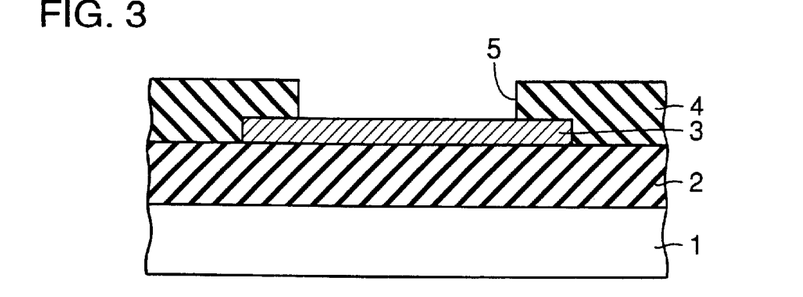
FIGS. 3 to 7 are cross sectional views showing first to fifth steps of a method of manufacturing the semiconductor device shown in FIGS. 1 and 2.

Next, a method of manufacturing the semiconductor device shown in FIGS. 1 and 2 will be described. Referring to FIG. 3, an interlayer insulating film 2 including a silicon oxide film is formed on a silicon substrate 1 by CVD (Chemical Vapor Deposition). An aluminum film is formed on interlayer insulating film 2. The aluminum film is patterned to form an interconnection layer 3. An interlayer insulating film 4 including a silicon oxide film is formed to cover interconnection layer 3 and interlayer insulating film 2 by combining methods including plasma CVD, Spin on Glass and etch back by dry etching. A resist is applied on interlayer insulating film 4 for photolithographically patterning, so that a resist pattern having a via hole pattern is formed. Using the resist pattern as a mask, interlayer insulating film 4 is etched by RIE (Reactive Ion Etching). Thus, a via hole 5 is formed. Thereafter, the resist pattern is removed using oxygen plasma or the like.

Figure 4:
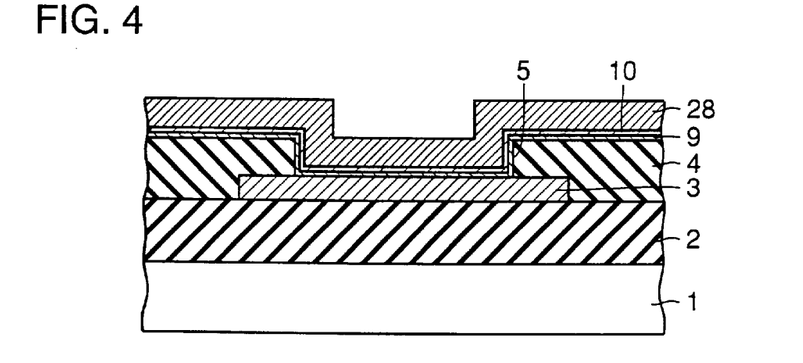

Referring to FIG. 4, a titanium layer 9 is formed by sputtering. A titanium nitride layer 10 is formed on titanium layer 9 by sputtering. A tungsten layer 28 is formed by CVD to cover an entire surface of titanium nitride layer 10. A thickness of tungsten layer 28 is about 5000 Å to about 10000 Å.

Figure 5:
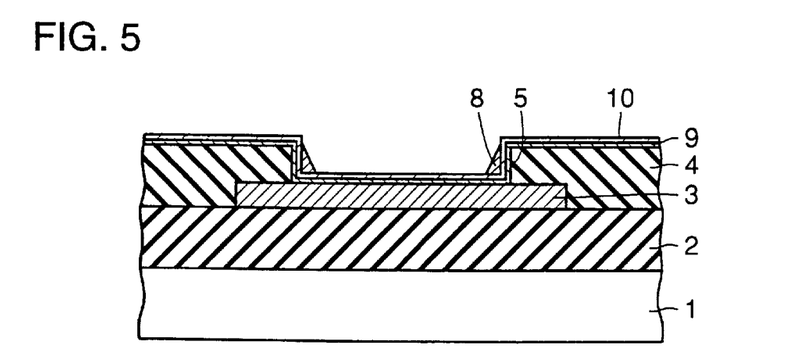

Referring to FIG. 5, an entire surface of tungsten layer 28 is etched back. At the time, as titanium nitride layer 10 must be left on the entire surface, a method which does not etch titanium nitride layer 10, such as a stop on TIN method, is used for the etch back. Thus, in a sidewall portion of via hole 5, the tungsten layer is left to form a sidewall conductive layer 8, whereas a central portion of via hole 5 does not have any tungsten layer.

Figure 6:
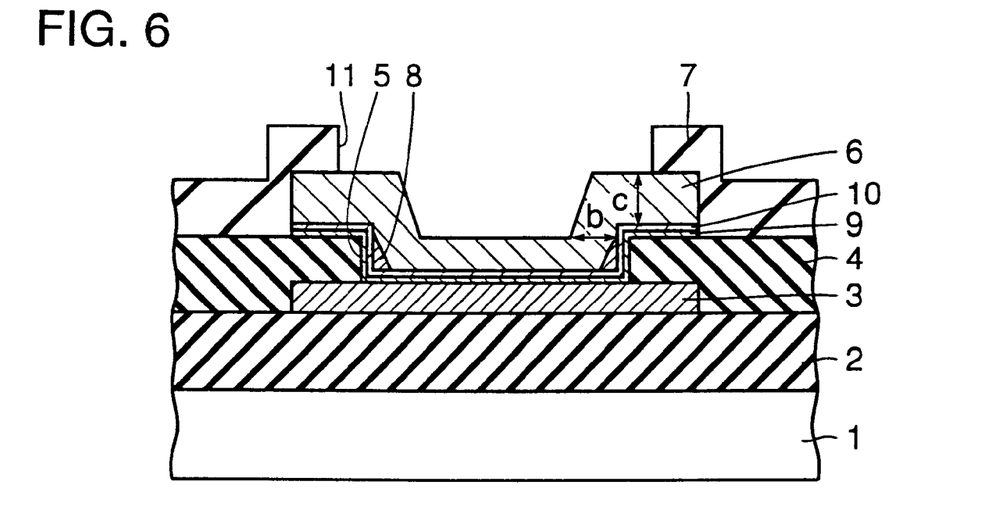

Subsequently, an aluminum film is formed to cover titanium nitride layer 10 and sidewall conductive layer 8. At the time, in via hole 5, interconnection layer 3 and the aluminum film are connected with titanium nitride layer 10 and titanium layer 9 interposed. As sidewall conductive layer 8 is formed in the sidewall portion of via hole 5, the aluminum film is formed on sidewall conductive layer 8. Then, the aluminum film is patterned by photolithography and RIE to form a bonding pad electrode layer 6. It is noted that although a side coverage ratio a (=a ratio of a thickness b to a thickness c of bonding pad electrode layer 6 in FIG. 6: b/c) at an end of such wide opening is about 0.5 when a general sputtering is used, sidewall conductive layer 8 increases the side coverage ratio a up to at least 0.6. A silicon nitride film of passivation film 7 is formed on the entire surface of bonding pad electrode layer 6 by plasma CVD. A via hole 11 leading to bonding pad electrode layer 6 is formed in passivation film 7.

Figure 7:
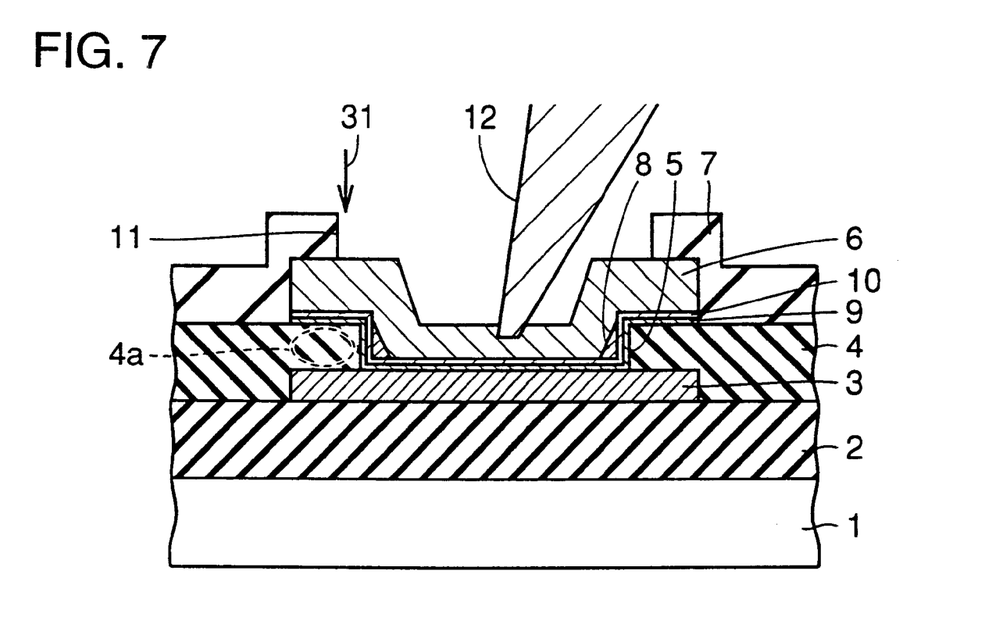

Referring to FIG. 7, a probe needle 12 including tungsten is brought into contact with bonding pad electrode layer 6 for probing the device. After a prescribed test is performed, probe needle 12 is separated from bonding pad electrode layer 6. Thereafter, a bonding wire 14 is connected to bonding pad electrode layer 6 to complete the semiconductor device shown in FIGS. 1 and 2.

In such semiconductor device, in the step shown in FIG. 7, a strong force is applied to a portion of bonding pad electrode layer 6 by probe needle 12 when probe needle 12 is brought into contact with bonding pad electrode layer 6. The force is transmitted to titanium nitride layer 10 and titanium layer 9. Titanium layer 9 and titanium nitride layer 10 are high particularly in mechanical strength as compared with aluminum, so that the force applied by probe needle 12 is dispersed in titanium nitride layer 10 and titanium layer 9. Thus, the force is dispersed generally to interconnection layer 3 positioned below titanium layer 9, whereby cracking of interlayer insulating film 2 below interconnection layer 3 is prevented. As a result, cracking of bonding pad electrode layer 6 would not be caused and the semiconductor device is provided with high reliability.

Further, in the step shown in FIG. 7, even when a force is applied by probe needle 12 in a direction indicated by an arrow 31, a crack at a portion 4a in interlayer insulating film 4 is avoided as titanium nitride layer 10 and titanium layer 9 are also formed on interlayer insulating film 4. As a result, the reliability of the semiconductor device is further increased.

Further, as titanium nitride layer 10 and titanium layer 9 are both high in adhesion with aluminum, bonding pad electrode layer 6 and interconnection layer 3 are tightly connected with titanium nitride layer 10 and titanium layer 9 interposed. Thus, when removing probe needle 12 from bonding pad electrode layer 6, separation of bonding pad electrode layer 6 and interconnection layer 3 is prevented. Thus, the semiconductor device with enhanced reliability is provided.

Although the embodiment of the present invention has been described, various modifications can be added to the embodiment. For example, although titanium nitride and titanium are used as materials forming the intermediate layer in the embodiment, the materials are not limited to this and a metal with high melting point such as molybdenum (Mo), tungsten (W), titanium silicide (TiSi), molybdenum silicide (MoSi), tungsten silicide (WSi), molybdenum nitride (MoN) or tungsten nitride (WN) may be used.

Further, although the intermediate layer includes two layers in the present embodiment, it is not limited to this and may include only one layer, or include three or more layers. Moreover, although the interconnection layer and bonding pad electrode layer include aluminum in the present embodiment, the layers may include aluminum alloy, and any material may be used as long as it is high in adhesion with the intermediate layer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

an interconnection layer including aluminum and formed on a semiconductor substrate;

a first insulating layer including a first hole having a sidewall and allowing a part of a surface of said interconnection layer to be exposed and formed to cover said interconnection layer;

a first intermediate layer containing titanium formed in contact with said interconnection layer and covering a surface of said first insulating layer, said sidewall of said first hole, and said exposed part of the surface of said interconnection layer;

a second intermediate layer including titanium nitride and in contact with said first intermediate layer;

a sidewall conductive layer including tungsten and formed on said sidewall of said first hole with said first and second intermediate layers interposed; and a bonding pad electrode layer including aluminum formed in said first hole to be connected to the surface of said interconnection layer with said first and second intermediate layers interposed and in contact with said second intermediate layer.

2. The semiconductor device according to claim 1, wherein a diameter of said first hole is at least 50 μm and at most 120 μm, and a depth of said first hole is at most 1 μm.

3. The semiconductor device according to claim 1, further comprising a second insulating layer covering said bonding pad electrode layer and provided with a second hole leading to said bonding pad electrode.

4. The semiconductor device according to claim 3, wherein said bonding pad electrode layer and said second intermediate layer are in contact with each other directly below said second hole, and said first intermediate layer and said interconnection layer are in contact with each other.

* * * * *